United States Patent
Kao et al.

(10) Patent No.: US 10,697,062 B2
(45) Date of Patent: Jun. 30, 2020

(54) GAS FLOW GUIDE DESIGN FOR UNIFORM FLOW DISTRIBUTION AND EFFICIENT PURGE

(71) Applicant: Applied Materials, Inc., Santa Clara, CA (US)

(72) Inventors: Chien-Teh Kao, Sunnyvale, CA (US); Jeffrey A. Kho, Union City, CA (US); Xiangxin Rui, Campbell, CA (US); Jianhua Zhou, Campbell, CA (US); Shinichi Kurita, San Jose, CA (US); Shouqian Shao, Fremont, CA (US); Guangwei Sun, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/032,854

(22) Filed: Jul. 11, 2018

(65) Prior Publication Data

US 2020/0017971 A1  Jan. 16, 2020

(51) Int. Cl.
*C23C 16/455* (2006.01)
*C23C 16/44* (2006.01)

(52) U.S. Cl.
CPC .... *C23C 16/45587* (2013.01); *C23C 16/4412* (2013.01); *C23C 16/45527* (2013.01); *C23C 16/45544* (2013.01)

(58) Field of Classification Search
CPC ........ C23C 16/45587; C23C 16/45527; C23C 16/4412; C23C 16/45544
USPC .................. 118/715; 156/345.33, 345.34
See application file for complete search history.

(56) References Cited

U.S. PATENT DOCUMENTS

| 5,725,673 | A | 3/1998 | Anderson et al. |
| 6,302,965 | B1 | 10/2001 | Umotoy et al. |
| 2009/0084317 | A1 | 4/2009 | Wu et al. |
| 2010/0272892 | A1* | 10/2010 | Kobayashi ........ C23C 16/45574 427/255.5 |
| 2013/0019978 | A1 | 1/2013 | Kools |

(Continued)

FOREIGN PATENT DOCUMENTS

WO   99-20811 A1   4/1999

OTHER PUBLICATIONS

PCT Notification of Transmittal of the International Search Report and the Written Opinion of the International Searching Authority for International Application No. PCT/US2019/038267; dated Oct. 17, 2019.

*Primary Examiner* — Rudy Zervigon
(74) *Attorney, Agent, or Firm* — Patterson + Sheridan LLP

(57) ABSTRACT

Embodiments described herein provide a chamber having a gas flow inlet guide to uniformly deliver process gas and a gas flow outlet guide to effectively purge process gasses and reduce purge time. The chamber includes a chamber body having a process gas inlet and a process gas outlet, a lid assembly, a process gas inlet and a process gas outlet configured to be in fluid communication with a processing region in the chamber, a gas flow inlet guide disposed in the process gas inlet, and a gas flow outlet guide disposed in the process gas outlet. The gas flow inlet guide includes a flow modulator and at least two first inlet guide channels having first inlet guide channel areas that are different. The gas flow outlet guide includes at least two first outlet guide channels having first outlet guide channel areas that are different.

19 Claims, 5 Drawing Sheets

(56) References Cited

U.S. PATENT DOCUMENTS

2016/0319422 A1 11/2016 Kurita et al.
2018/0155835 A1 6/2018 Kurita et al.

* cited by examiner

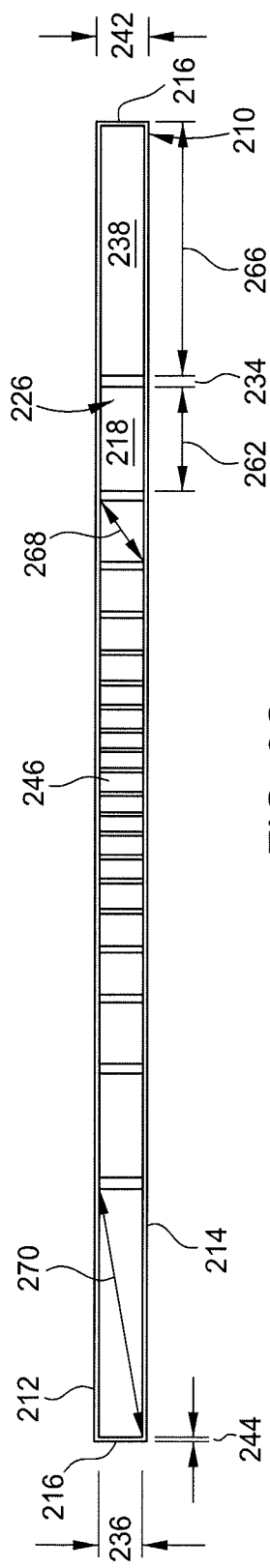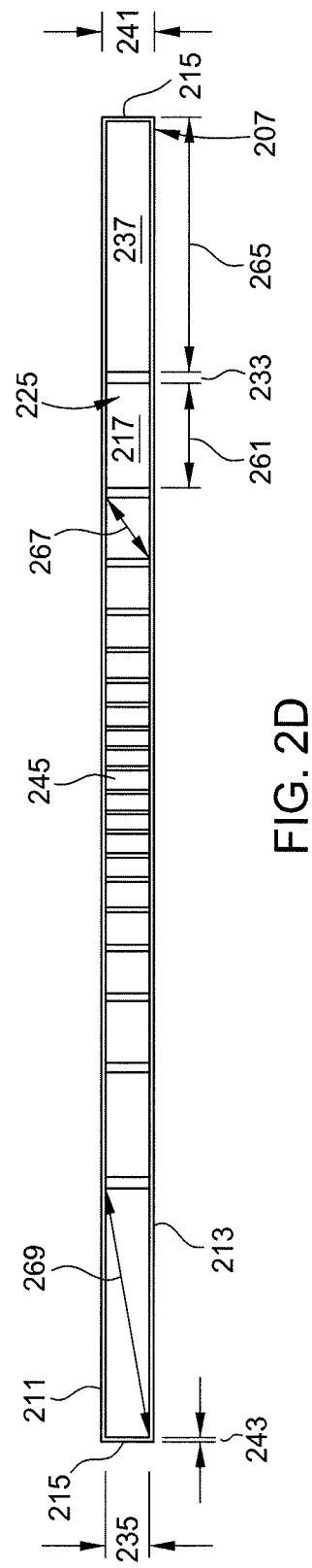

GAS FLOW GUIDE DESIGN FOR UNIFORM FLOW DISTRIBUTION AND EFFICIENT PURGE

BACKGROUND

Field

Embodiments of the present disclosure generally relate to an atomic layer deposition (ALD) chamber. More particularly, embodiments of the present disclosure relate to an ALD chamber to uniformly deliver process gas and effectively purge process gasses.

Description of the Related Art

ALD is based upon atomic layer epitaxy (ALE) and employs chemisorption techniques to deliver precursor molecules on a surface in sequential cycles. The substrate is disposed in a processing region of an ALD chamber. A first precursor flows into the processing region across the substrate and is exhausted from the processing region. Then, a second precursor flows into the processing region across the substrate and is exhausted from the processing region. Optionally, a purge gas may be introduced between introductions of the precursors. The first and second precursors react to form a product compound as a film on the substrate surface. The cycle is repeated to form the layer to a desired thickness.

However, precursors and purge gasses, also known as process gasses, may not be uniformly distributed across the processing region, and thus may not be uniformly distributed across the substrate. Therefore, the film thickness distribution of the substrate may not be uniform. Also, the process gasses in the processing region may not be effectively exhausted from the processing region such that residual gasses remain in the processing region. The residual process gasses remaining in the chamber affect the quality of the film. Additionally, the time required to purge process gasses to ensure that residual process gasses do not remain in the processing region decreases throughput.

Accordingly, what is needed in the art is a chamber having a gas flow inlet guide to uniformly deliver process gas and a gas flow outlet guide to effectively purge process gasses and reduce purge time.

SUMMARY

In one embodiment, a gas flow inlet guide is provided. The gas flow inlet guide includes a flow guide body having a top, a bottom, body sidewalls, a flow guide inlet, and a flow guide outlet, and a flow modulator disposed within the flow guide body including at least one opening having a diameter and at least one first channel. The at least one first channel includes a first sidewall and a second sidewall, a first channel area, a first channel volume, a first inlet width at the flow modulator from the first sidewall to the second sidewall, a first outlet width at a first channel outlet from the first sidewall to the second sidewall, and a first cross-sectional area defined by the first outlet width and a sidewall height. A plenum is present between the flow modulator and the flow guide inlet. The first sidewall and the second sidewall have different lengths from the flow modulator to the first channel outlet disposed in the flow guide outlet. The first sidewall and the second sidewall have a sidewall width and the sidewall height. The first channel area is defined by the flow modulator, the first sidewall, the second sidewall, and the first channel outlet. The first channel volume is defined by the flow modulator, the first sidewall, the second sidewall, the first channel outlet, the bottom of the flow guide body, and the top of the flow guide body. The first cross-sectional area is defined by the first outlet width and the sidewall height, wherein a plenum is present between the flow modulator and the flow guide inlet.

In another embodiment, a gas flow outlet guide is provided. The gas flow outlet guide includes a flow guide body having a top, a bottom, body sidewalls, a flow guide inlet, and a flow guide outlet configured to be coupled to a pump. The at least one first channel includes a first sidewall and a second sidewall, a first channel area, a first channel volume, a first inlet width at a first channel inlet from the first sidewall to the second sidewall, a first outlet width at the first channel outlet from the first sidewall to the second sidewall, and a first cross-sectional area defined by the first outlet width and a sidewall height. The first sidewall and the second sidewall have different lengths from the first channel outlet to the first channel inlet. The first sidewall and the second sidewall have a sidewall width and the sidewall height. The first channel area is defined the first channel inlet, the first sidewall, the second sidewall, and the first channel outlet. The first channel volume is defined by the first channel inlet, the first sidewall, the second sidewall, the first channel outlet, the bottom of the flow guide body, and the top of the flow guide body. The first cross-sectional area is defined by the first inlet width and the sidewall height.

In yet another embodiment, an atomic layer deposition (ALD) chamber is provided. The chamber includes a chamber body having a process gas inlet and a process gas outlet, a lid assembly disposed at an upper end of the chamber body, a process gas inlet and a process gas outlet configured to be in fluid communication with a processing region in the chamber, a gas flow inlet guide disposed in the process gas inlet, and a gas flow outlet guide disposed in the process gas outlet. The gas flow inlet guide includes a flow modulator and at least two first inlet guide channels having first inlet guide channel areas that are different. The gas flow outlet guide includes at least two first outlet guide channels having first outlet guide channel areas that are different.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2C is a schematic side view of a gas flow inlet guide according to an embodiment.

FIG. 2D is a schematic side view of a gas flow outlet guide according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a chamber having a gas flow inlet guide to uniformly deliver process gas and a gas flow outlet guide to effectively purge process gasses and reduce purge time. The chamber includes a chamber body having a process gas inlet and a process gas outlet, a lid assembly, a process gas inlet and a process gas outlet configured to be in fluid communication with a processing region in the chamber, a gas flow inlet guide disposed in the process gas inlet, and a gas flow outlet guide disposed in the process gas outlet. The gas flow inlet guide includes a flow modulator and at least two first inlet guide channels having first inlet guide channel areas that are different. The gas flow outlet guide includes at least two first outlet guide channels having first outlet guide channel areas that are different.

Figure 1:
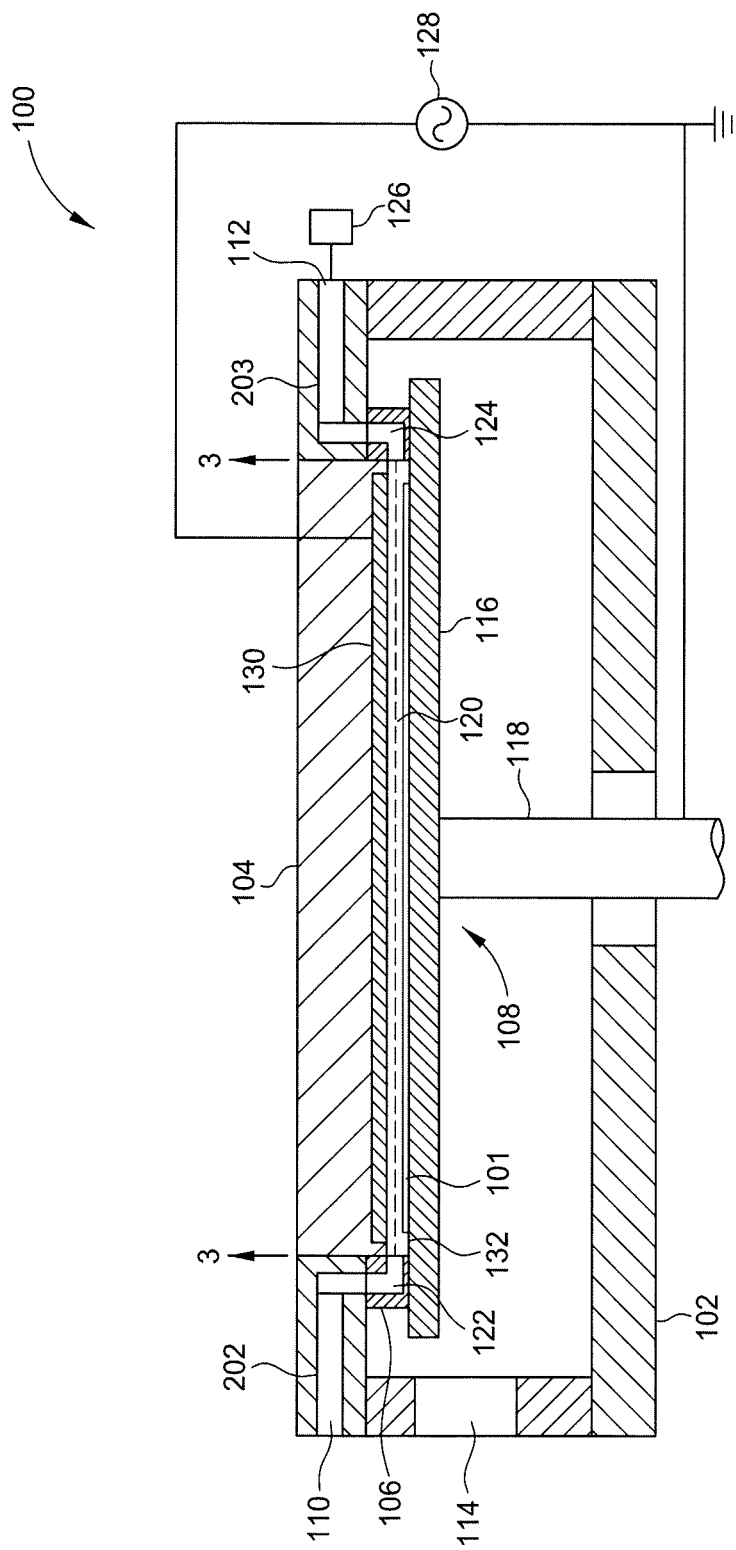
FIG. 1 is a schematic cross-sectional view of an atomic layer deposition chamber according to an embodiment.

FIG. 1 is a schematic cross-sectional view of an ALD chamber 100 according to one embodiment. Suitable ALD chambers may be obtained from Applied Materials, Inc. located in Santa Clara, Calif. It is to be understood that the system described below is an exemplary chamber and other chambers, including chambers from other manufacturers, may be used with or modified to accomplish aspects of the present disclosure. The ALD chamber 100 includes a chamber body 102, a lid assembly 104, a process kit 106, a substrate support assembly 108, a process gas inlet 110, and a process gas outlet 112.

The lid assembly 104 is disposed at an upper end of the chamber body 102, and the substrate support assembly 108 is at least partially disposed within the chamber body 102. The process kit 106 is coupled to the lid assembly 104. The substrate support assembly 108 includes a pedestal 116 movably disposed in the chamber body 102 by a stem 118. The pedestal 116 includes a substrate support surface 132 configured to support a substrate 101. The stem 118 extends through the chamber body 102 where it is connected to a lift system (not shown) that moves the pedestal 116 between a processing position (as shown) and a transfer position. The transfer position facilitates transfer of the substrate 101 through a slit valve opening 114 formed in a sidewall of the chamber body 102 to provide access to the interior of the ALD chamber 100.

In the processing position, the substrate support assembly 108 contracts the process kit 106 to form a processing region 120 defined by the substrate support surface 132, process kit 106, and lower surface of the lid assembly 104. When the substrate support assembly 108 in the processing position contacts the process kit 106 to form a processing region 120, a gas inlet 122 and a gas outlet 124 of the process kit 106 are coupled to the process gas inlet 110 and the process gas outlet 112, respectively, are positioned to be in fluid communication with the processing region 120. In this manner, the process gases are provided to the process gas inlet 110 and to the processing region 120 through the gas inlet 122. The process gas outlet 112 is connected to a pump 126. The process gases flow in the processing region 120 across the substrate 101 and are exhausted through the gas outlet 124 and process gas outlet 112 by the pump 126. An RF (radio frequency) source 128 is coupled an electrode 130 of the lid assembly 104. The RF source 128 powers the electrode 130 to facilitate generation of plasma from process gases in the processing region 120. The pedestal 116 is grounded or the pedestal 116 may serve as a cathode when connected to the RF source 128 to generate a capacitive electric field between the lower surface of the lid assembly 104 and the pedestal 116 to accelerate plasma species toward the substrate 101.

The particular gas or gases used for ALD depend upon the process or processes to be performed. In one embodiment, the gases can include trimethylaluminium $(CH_3)_3Al$ (TMA), tetrakis ethyl methyl amino zirconium $Zr[N(CH_3)(C_2H_5)]_4$ (TEMAZ), nitrogen $(N_2)$, and oxygen $(O_2)$, however, the gases are not so limited and may include one or more precursors, reductants, catalysts, carriers, purge gases, cleaning gases, or any mixture or combination thereof. The gases are introduced into the ALD chamber 100 from one side and flow across the substrate 101. For example, gasses are flowed though process gas inlet 110, the gas inlet 122, and across the processing region 120 and are exhausted through the gas outlet 124 and process gas outlet 112. In an exemplary aluminum oxide $(Al_2O_3)$ film forming process, a flow of TMA is delivered to the processing region 120. The TMA flowing across the processing region 120 flows across the substrate 101 and forms a layer of TMA on the substrate 101. A flow of oxygen-containing gas is delivered to the processing region 120. The oxygen-containing gas flowing across the processing region 120 flows across the substrate 101 and is activated into a plasma to provide oxygen radicals for a reaction with the layer of TMA. In one embodiment, the oxygen-containing gas is $O_2$ or ozone $(O_3)$. The oxygen radicals react with the layer of TMA on the substrate 101, forming a layer of $Al_2O_3$. Repetition of the flowing TMA, the flowing of the oxygen-containing gas, and the activating the oxygen-containing gas into a plasma to form additional layers on the substrate 101 continues until an $Al_2O_3$ film having a desired thickness is formed.

In an exemplary zirconium dioxide $(ZrO_2)$ film forming process, a flow of TEMAZ is delivered to the processing region 120. The TEMAZ flowing across the processing region 120 flows across the substrate 101 and forms a layer of TEMAZ on the substrate 101. A flow of oxygen-containing gas is delivered to the processing region 120. The oxygen-containing gas flowing across the processing region 120 flows across the substrate 101 and is activated into a plasma to provide oxygen radicals for a reaction with the layer of TEMAZ. The oxygen radicals react with the layer of TEMAZ on the substrate 101, forming a layer of $ZrO_2$ on the substrate 101. Repetition of the flowing TEMAZ, the flowing $O_2$, and the activating the oxygen-containing gas into a plasma continues until a $ZrO_2$ film having a desired thickness is formed.

However, in the exemplary $Al_2O_3$ film forming process and the exemplary zirconium dioxide $ZrO_2$ film forming process, the flow of the process gas may not be uniformly distributed across the processing region 120, and thus may not be uniformly distributed across the substrate 101. Therefore, the film thickness distribution of the substrate 101 may not be uniform, which should be preferably prevented. Also, the process gasses in the processing region 120, the process gas inlet 110, and gas inlet 122 may not be effectively exhausted from the processing region 120 such that residual gasses remain in the processing region 120, the process gas inlet 110, and gas inlet 122. The residual process gasses remaining in the chamber affect the quality of the film. For example, in the exemplary $ZrO_2$ film forming process, residual TEMAZ in the processing region 120 during the activating $O_2$ into a plasma may result in deposition of residual particles on the $ZrO_2$ layer. The residual particles affect the quality and uniformity of the of the $ZrO_2$ film. Additionally, the time required to ensure that residual process gasses do not remain in the processing region 120, the process gas inlet 110, and gas inlet 122 for exhausting the process gasses, herein described as purging process gasses decreases the throughput of film processing. Accordingly, a gas flow inlet guide 202 is provided to uniformly deliver process gas flow and a gas flow outlet guide 203 is provided to effectively purge process gasses and reduce purge time.

Figure 2A:
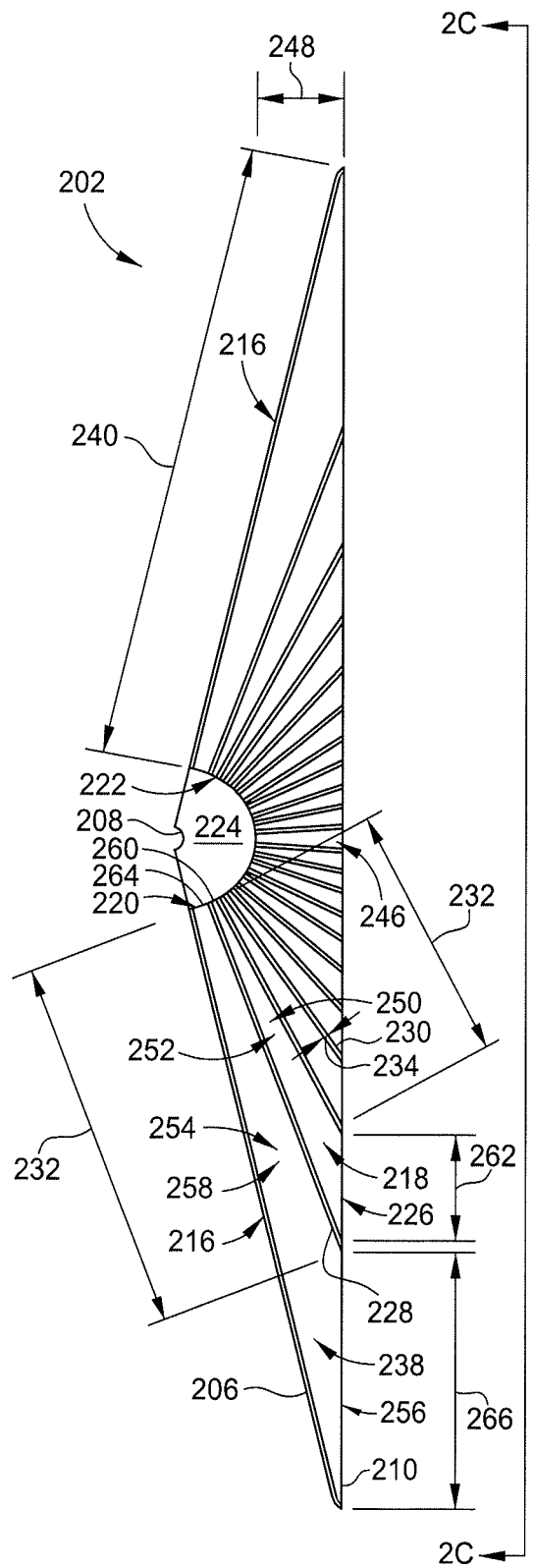
FIG. 2A is a schematic top view of a gas flow inlet guide according to an embodiment.

FIG. 2A is a schematic top view and FIG. 2C is a schematic side view of the gas flow inlet guide 202. FIG. 2E is a schematic planar view of a flow modulator 220. The gas flow inlet guide 202 is disposed in the process gas inlet 110 (shown in FIG. 1). The gas flow inlet guide 202 includes a flow guide body 206 having a flow guide inlet 208 and a flow guide outlet 210. The flow guide body 206 includes a top 212, a bottom 214, and body sidewalls 216. Disposed within the flow guide body 206 are at least one channel first 218 and a flow modulator 220 including at least one opening 222. A plenum 224 is formed between the flow modulator 220 and the flow guide inlet 208. The flow guide outlet 210 includes at least one first channel outlet 226.

The first channel 218 is defined by a first sidewall 228 and a second sidewall 230. The first sidewall 228 and the second sidewall 230 have different lengths 232 from the flow modulator 220 to a first channel outlet 226. The first sidewall 228 and the second sidewall 230 have a sidewall width 234 and a sidewall height 236. At least one second channel 238 is disposed within the flow guide body 206. The second channel 238 is defined by a first sidewall 228 and one of the body sidewalls 216. The body sidewalls 216 have different lengths 240 from the flow modulator 220 to a first channel outlet 226 than lengths 232. The body sidewalls 216 have a body sidewall height 242 and a body sidewall width 244. In one embodiment, a center channel 246 is disposed within the flow guide body 206. The center channel has a first sidewall 228 and second sidewall 230. The first sidewall 228 and the second sidewall 230 have the same length 248 from the flow modulator 220 to a first channel outlet 226.

The at least one first channel 218 and the center channel 246 have a first channel area 250 defined by the flow modulator 220, the first sidewall 228, the second sidewall 230, and the first channel outlet 226. The first channel area 250 of at least two first channels 218 is different. The at least one first channel 218 and the center channel 246 have a first channel volume 252 defined by the flow modulator 220, the first sidewall 228, the second sidewall 230, the first channel outlet 226, the bottom 214 of the flow guide body 206, and the top 212 of the flow guide body 206. The first channel volume 252 of at least two first channels 218 is different. The at least one second channel 238 has a second channel area 254 defined by the flow modulator 220, the first sidewall 228, one of the body sidewalls 216, and a second channel outlet 256. The at least one second channel 238 has a second channel volume 258 defined by the flow modulator 220, the first sidewall 228, one of the body sidewalls 216, the second channel outlet 256, the bottom 214 of the flow guide body 206, and the top 212 of the flow guide body 206.

The at least one first channel 218 and center channel 246 have a first inlet width 260 at the flow modulator 220 from the first sidewall 228 to the second sidewall 230. The at least one first channel 218 and the center channel 246 has a first outlet width 262 at the first channel outlet 226 from the first sidewall 228 to the second sidewall 230. The at least one second channel has a second inlet width 264 at the flow modulator 220 from the first sidewall 228 to one of the body sidewalls 216. The at least one second channel has a second outlet width 266 at the second channel outlet 256 from the first sidewall 228 to one of the body sidewalls 216. In one embodiment, each first inlet width 260 and each second inlet width 264 are substantially the same. In another embodiment, the first inlet width 260 of at least two first channels 218 is different. The at least one first channel outlet 226 has a first cross-sectional area 268 defined by the first outlet width 262 and the sidewall height 236. The at least one second channel outlet 256 has a second cross-sectional area 270 defined by the second outlet width 266 and the body sidewall height 242. In one embodiment, each first cross-sectional area 268 and each second cross-sectional area 270 are substantially the same. In another embodiment, first cross-sectional area 268 of at least two first channel outlets 226 is different.

Figure 3:
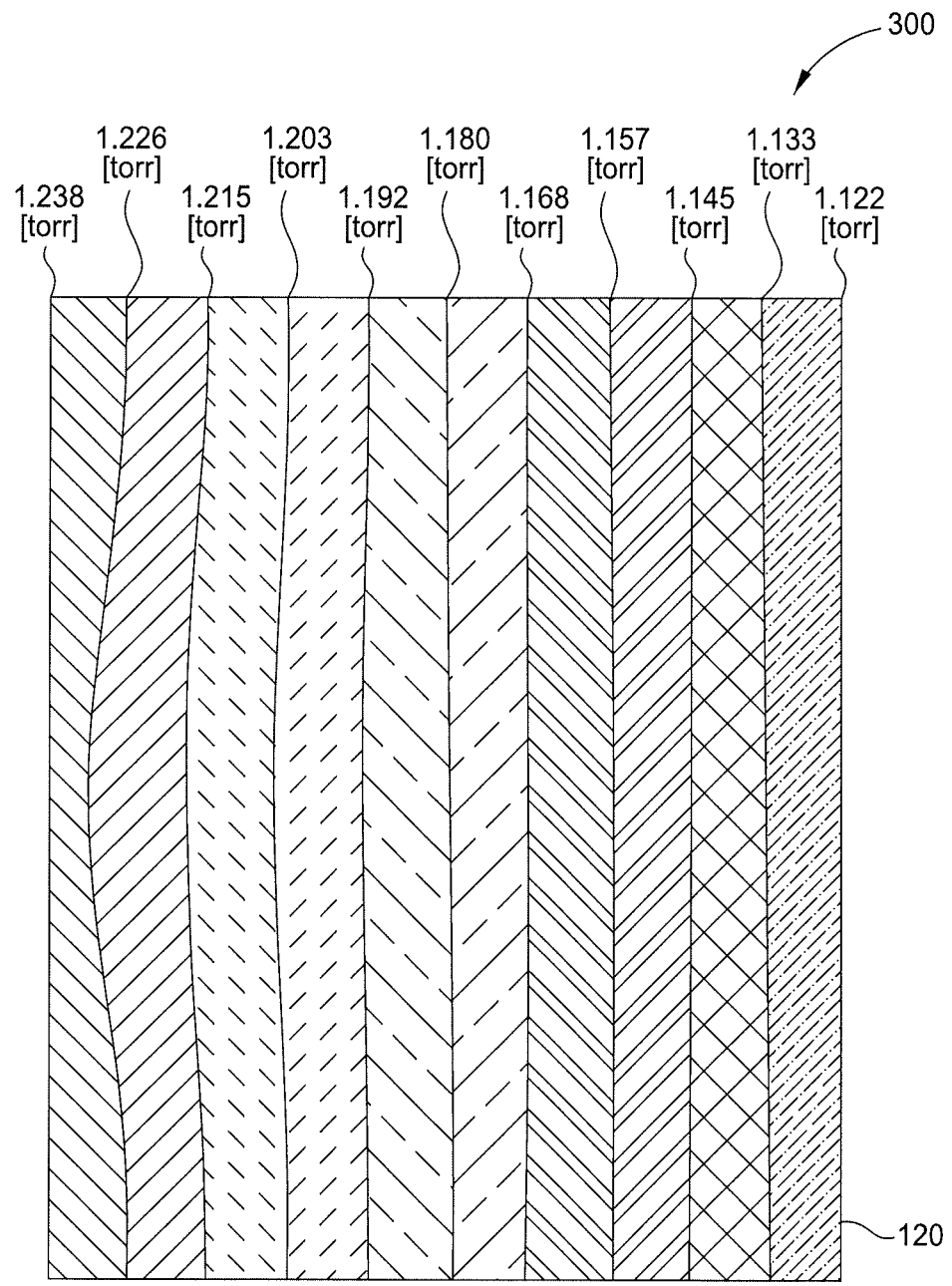
FIG. 3 is a schematic top view of the processing region of an atomic layer deposition chamber according to an embodiment.

The gas flow inlet guide 202 allows process gasses to distribute in the plenum 224 and separate into a plurality of individual flows in at least one first channel 218. In one embodiment, the gas flow inlet guide 202 allows process gasses to distribute in the plenum 224 and separate into a plurality of individual flows in at least one first channel 218, center channel 246, and at least one second channel 238. The at least one opening 222 of the gas flow modulator 220 has a diameter 272. In one embodiment, the diameter 272 of each opening 222 is selected to account for differences of the first channel volume 252 and first channel area 250 for at least two first channels 218 and differences of the first cross-sectional area 268 of at least two first channel outlets 226 so that each individual flow has substantially the same velocity and volume for the process gas for substantially uniformly distribution across the processing region 120. In another embodiment, the diameter 272 of each opening 222 is selected to further account for differences of the first channel volume 252 and second channel volume 258, and differences of the first channel area 250 and second channel area 254 so that each individual flow has substantially the same velocity and volume for the process gas for substantially uniformly distribution across the processing region 120. As shown in FIG. 3, a schematic top view of the processing region 120, the gas flow modulator 220 of the gas flow inlet guide 202 provides a substantially uniform change in pressure, also known as a process profile 300, across the processing region 120.

Figure 2B:
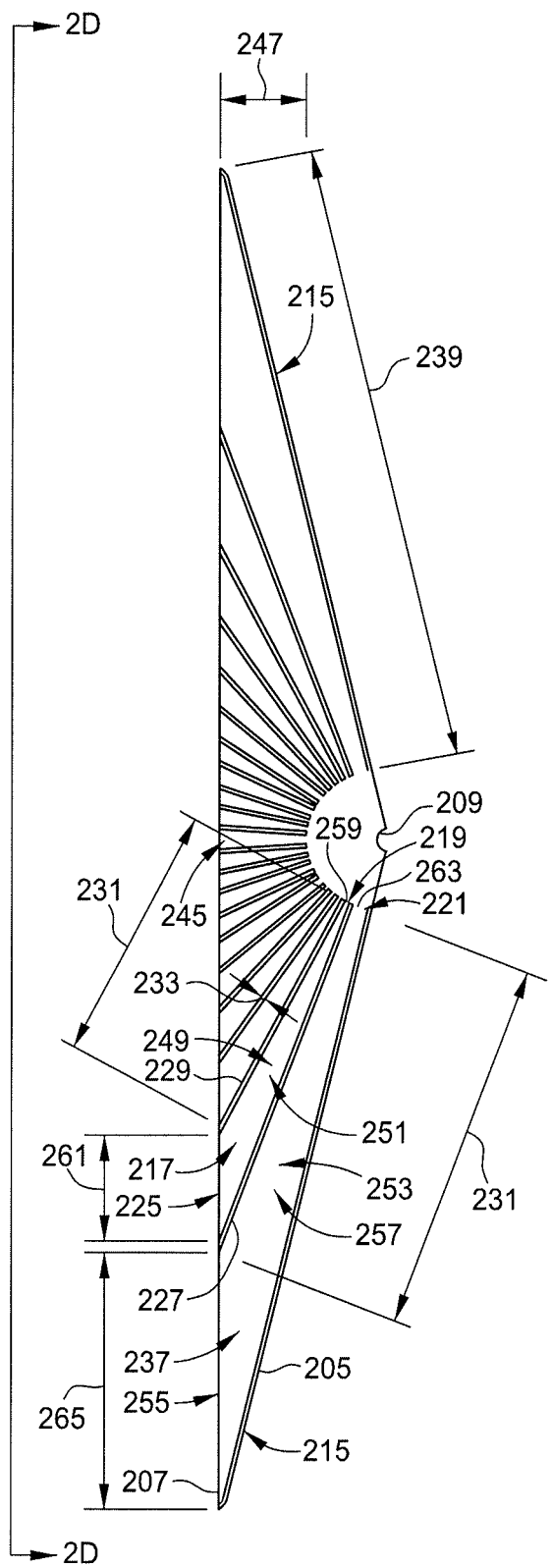
FIG. 2B is a schematic top view of a gas flow outlet guide according to an embodiment.
Figure 2E:
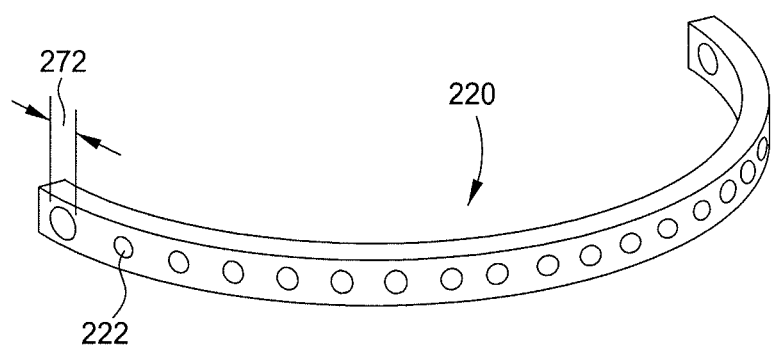
FIG. 2E is a schematic planar view of a flow modulator according to an embodiment.

FIG. 2B is a schematic top view and FIG. 2D is a schematic side view of the gas flow outlet guide 203. The gas flow outlet guide 203 is disposed in the process gas outlet 112 (shown in FIG. 1) or the gas outlet 124. The gas flow outlet guide 203 includes a flow guide body 205 having a flow guide inlet 207 and a flow guide outlet 209. The flow guide body 205 includes a top 211, a bottom 213, and body sidewalls 215. The flow guide inlet 207 includes at least one first channel inlet 217.

Disposed within the flow guide body 205 is at least one first channel 217. The first channel 217 is defined by a first sidewall 227 and a second sidewall 229. The first sidewall 227 and the second sidewall 229 have different lengths 231 from a first channel inlet 225 to a first channel outlet 219 The first sidewall 227 and the second sidewall 229 have a sidewall width 233 and a sidewall height 235. At least one second channel 237 is disposed within the flow guide body 206. The second channel 237 is defined by a first sidewall 227 and one of the body sidewalls 215. The body sidewalls 215 have different lengths 239 from a second channel inlet 255 to a second channel outlet 221 than lengths 231. The body sidewalls 215 have a body sidewall height 241 and a body sidewall width 243. In one embodiment, a center channel 245 is disposed within the flow guide body 205. The center channel has first sidewall 227 and second sidewall 229. The first sidewall 227 and the second sidewall 229 have the same length 247 from the first channel inlet 225 to the first channel outlet 219.

The at least one first channel 217 and the center channel 245 have a first channel area 249 defined by the first channel outlet 219, the first sidewall 227, the second sidewall 229, and the first channel inlet 225. The first channel area 249 of at least two first channels 217 is different. The at least one first channel 217 and the center channel have a first channel volume 251 defined by the first channel outlet 219, the first sidewall 227, the second sidewall 229, the first channel inlet 225, the bottom 213 of the flow guide body 205, and the top 211 of the flow guide body 205. The first channel volume 251 of at least two first channels 217 is different. The at least one second channel 237 has a second channel area 253 defined by the second channel outlet 221, the first sidewall 227, one of the body sidewalls 215, and the second channel inlet 255. The at least one second channel 237 has a second channel volume 257 defined by the second channel outlet 221, the first sidewall 227, one of the body sidewalls 215, the second channel inlet 255, the bottom 213 of the flow guide body 205, and the top 211 of the flow guide body 205.

The at least one first channel 217 and center channel 245 have a first outlet width 259 at the first channel outlet 219 from the first sidewall 227 to the second sidewall 229. The at least one first channel 217 and the center channel 245 has a first inlet width 261 at the first channel inlet 225 from the first sidewall 227 to the second sidewall 229. The at least one second channel has a second inlet width 265 at the second channel inlet 255 from the first sidewall 227 to one of the body sidewalls 215. The at least one second channel 237 has a second outlet width 263 at the second channel outlet 221 from the first sidewall 227 to one of the body sidewalls 215. In one embodiment, each first inlet width 261 and each second inlet width 265 are substantially the same. In another embodiment, the first inlet width 261 of at least two first channels 217 is different. The at least one first channel inlet 225 has a first cross-sectional area 267 defined by the first inlet width 261 and the sidewall height 235. The at least second channel inlet 255 has a second cross-sectional area 269 defined by the second inlet width 265 and the body sidewall height 241. In one embodiment, each first cross-sectional area 267 and each second cross-sectional area 269 are substantially the same. In another embodiment, first cross-sectional area 267 of at least two first channel inlets 225 is different.

The gas flow outlet guide 203 allows effective purging of process gasses and reduced purging time. The process gases distributed in in the processing region 120 and the pump 126 exhausts the gases through the gas outlet 124 and process gas outlet 112 resulting in a center-to-edge change in pressure in the processing volume. The at least one first channel 217 and center channel allow process gasses distributed in processing region 120 to separate into a plurality of individual flows in at least one first channel 217 to control the center-to-edge change in pressure in the processing region 120 for substantially uniform purging of the process gas from the processing region 120. In another embodiment, the at least one first channel 217, the center channel 245, and the at least one second channel 237 allows process gasses distributed in processing region 120 to separate into a plurality of individual flows in at least one first channel 217 and the center channel 245 to control the center-to-edge change in pressure for substantially uniform purging of the process gas from the processing region 120.

In summation, a gas flow inlet guide for providing uniform delivery of process gas flow to a processing region of an atomic layer deposition (ALD) chamber and a gas flow outlet guide providing effective purging process gasses and reduce purge time. For the gas flow inlet guide, the utilization of the at least one first channel allows process gasses to separate into a plurality of individual flows. The at least one opening of the gas flow modulator has a diameter that is selected to account for differences of at least two first channel outlets so that each individual flow has substantially the same velocity and volume for the process gas for substantially uniformly distribution across the processing region. For the gas flow outlet guide, at least one first channel separates process gasses distributed in the processing volume into a plurality of individual flows to control the center-to-edge change in pressure in the processing region for substantially uniform purging of the process gas from the processing region. Substantially uniform purging of the process gas allow for effective exhaustion of the process gasses such that residual process gasses do not remaining in the processing region. Effective exhaustion reduces purge time as the less time is required to ensure that residual process gasses do not remain in the processing region.

While the foregoing is directed to examples of the present disclosure, other and further examples of the disclosure may be devised without departing from the basic scope thereof, and the scope thereof is determined by the claims that follow.

What is claimed is:

1. A gas flow inlet guide, comprising:
a flow guide body having a top, a bottom, body sidewalls, a flow guide inlet, and a flow guide outlet; and
a flow modulator disposed within the flow guide body including at least one opening having a diameter and at least one first channel, the at least one first channel includes:
a first sidewall and a second sidewall extending along radii centered at the flow modulator, the first sidewall and the second sidewall having different lengths from the flow modulator to a first channel outlet disposed in the flow guide outlet, the first sidewall and the second sidewall have a sidewall width and a sidewall height;
a first channel area defined by the flow modulator, the first sidewall, the second sidewall, and the first channel outlet;
a first channel volume defined by the flow modulator, the first sidewall, the second sidewall, the first channel outlet, the bottom of the flow guide body, and the top of the flow guide body;
a first inlet width at the flow modulator from the first sidewall to the second sidewall;
a first outlet width at the first channel outlet from the first sidewall to the second sidewall; and
a first cross-sectional area defined by the first outlet width and the sidewall height, wherein a plenum is present between the flow modulator and the flow guide inlet.

2. The gas flow inlet guide of claim 1, wherein the gas flow inlet guide is configured to be disposed in a process gas inlet within an atomic layer deposition (ALD) chamber.

3. The gas flow inlet guide of claim 1, wherein the first channel area of at least two first channels is different.

4. The gas flow inlet guide of claim 1, wherein the first channel volume of at least two first channels is different.

5. The gas flow inlet guide of claim 1, wherein each first inlet width is substantially the same.

6. The gas flow inlet guide of claim 1, wherein the first outlet width of at least two first channels is different.

7. The gas flow inlet guide of claim 1, wherein the first cross-sectional area of at least two first channels is substantially the same.

8. The gas flow inlet guide of claim 1, wherein the diameter of each opening is selected to account for differences of the first channel volume and the first channel area of at least two first channels.

9. A atomic layer deposition (ALD) chamber, comprising:
a chamber body having a process gas inlet and a process gas outlet;
a lid assembly disposed at an upper end of the chamber body;
a gas flow inlet guide comprising:
 a flow guide body having a top, a bottom, body sidewalls, a flow guide inlet, and a flow guide outlet; and
 a flow modulator disposed within the flow guide body including at least one opening having a diameter and at least one first channel, the at least one first channel includes:
  a first sidewall and a second sidewall extending along radii centered at the flow modulator, the first sidewall and the second sidewall having different lengths from the flow modulator to a first channel outlet disposed in the flow guide outlet, the first sidewall and the second sidewall have a sidewall width and a sidewall height;
  a first channel area defined by the flow modulator, the first sidewall, the second sidewall, and the first channel outlet;
  a first channel volume defined by the flow modulator, the first sidewall, the second sidewall, the first channel outlet, the bottom of the flow guide body, and the top of the flow guide body;
  a first inlet width at the flow modulator from the first sidewall to the second sidewall;
  a first outlet width at the first channel outlet from the first sidewall to the second sidewall; and
  a first cross-sectional area defined by the first outlet width and the sidewall height, wherein a plenum is present between the flow modulator and the flow guide inlet disposed in the process gas inlet; and
a gas flow outlet guide disposed in the process gas outlet, the gas flow outlet guide includes at least two first outlet guide channels having first outlet guide channel areas that are different.

10. The chamber of claim 9, wherein the first channel volume of at least two first channels is different is different and the first cross-sectional area of the at least two first channels is different is substantially the same.

11. The chamber of claim 10, wherein the diameter of each opening is selected to account for differences of the first channel volume and the first channel area of the at least two first channels.

12. The chamber of claim 9, wherein at least two first outlet guide channels have first outlet guide channel volumes that are different.

13. The gas flow inlet guide of claim 9, wherein the first channel area of at least two first channels is different.

14. The gas flow inlet guide of claim 9, wherein the first channel volume of at least two first channels is different.

15. A gas flow inlet guide, comprising:
a flow guide body having a top, a bottom, body sidewalls, a flow guide inlet, and a flow guide outlet; and
a flow modulator disposed within the flow guide body including at least one opening having a diameter and at least one first channel, the at least one first channel includes:
 a first sidewall and a second sidewall extending along radii centered at the flow modulator, the first sidewall and the second sidewall having different lengths from the flow modulator to a first channel outlet disposed in the flow guide outlet, the first sidewall and the second sidewall have a sidewall width and a sidewall height;
 a first channel area defined by the flow modulator, the first sidewall, the second sidewall, and the first channel outlet;
 a first channel volume defined by the flow modulator, the first sidewall, the second sidewall, the first channel outlet, the bottom of the flow guide body, and the top of the flow guide body;
 a first inlet width at the flow modulator from the first sidewall to the second sidewall, each first inlet width is substantially the same;
 a first outlet width at the first channel outlet from the first sidewall to the second sidewall; and
 a first cross-sectional area defined by the first outlet width and the sidewall height, wherein a plenum is present between the flow modulator and the flow guide inlet.

16. The gas flow inlet guide of claim 15, wherein the gas flow inlet guide is configured to be disposed in a process gas inlet within an atomic layer deposition (ALD) chamber.

17. The gas flow inlet guide of claim 15, wherein the first channel area of at least two first channels is different.

18. The gas flow inlet guide of claim 15, wherein the first channel volume of at least two first channels is different.

19. The gas flow inlet guide of claim 15, wherein the diameter of each opening is selected to account for differences of the first channel volume and the first channel area of at least two first channels.

* * * * *